(12) United States Patent
Wu

(10) Patent No.: US 7,274,048 B2
(45) Date of Patent: Sep. 25, 2007

(54) SUBSTRATE BASED ESD NETWORK PROTECTION FOR A FLIP CHIP

(75) Inventor: Chau-Neng Wu, Hsin-chu (TW)

(73) Assignee: Taiwan Semiconductor Manufacturing Company, Ltd. (TW)

( * ) Notice: Subject to any disclaimer, the term of this patent is extended or adjusted under 35 U.S.C. 154(b) by 306 days.

(21) Appl. No.: 11/009,450

(22) Filed: Dec. 10, 2004

(65) Prior Publication Data

US 2005/0093071 A1    May 5, 2005

Related U.S. Application Data

(63) Continuation of application No. 10/308,446, filed on Dec. 3, 2002, now Pat. No. 6,849,479.

(51) Int. Cl.
| | |
|---|---|
| H01L 29/72 | (2006.01) |
| H01L 29/792 | (2006.01) |
| H01L 23/62 | (2006.01) |
| H01L 31/00 | (2006.01) |
| H01L 43/00 | (2006.01) |
| H01L 29/00 | (2006.01) |
| H01L 23/552 | (2006.01) |
| H01L 29/40 | (2006.01) |
| H01L 21/00 | (2006.01) |
| H01L 21/31 | (2006.01) |
| H02H 9/00 | (2006.01) |
| H02H 3/20 | (2006.01) |

(52) U.S. Cl. ............... 257/173; 257/328; 257/355; 257/358; 257/404; 257/758; 257/778; 438/108; 438/731; 361/56; 361/91.1

(58) Field of Classification Search ............... None
See application file for complete search history.

(56) References Cited

U.S. PATENT DOCUMENTS

| | | | | |
|---|---|---|---|---|
| 5,185,654 A * | 2/1993 | Mosher et al. | ............... | 257/659 |
| 5,903,419 A * | 5/1999 | Smith | ............... | 361/56 |
| 5,904,499 A * | 5/1999 | Pace | ............... | 438/108 |
| 5,923,067 A * | 7/1999 | Voldman | ............... | 257/349 |
| 5,945,713 A * | 8/1999 | Voldman | ............... | 257/355 |
| 5,970,321 A | 10/1999 | Hively | ............... | 438/123 |
| 6,078,068 A * | 6/2000 | Tamura | ............... | 257/203 |
| 6,144,542 A | 11/2000 | Ker et al. | ............... | 361/111 |
| 6,211,554 B1 * | 4/2001 | Whitney | ............... | 257/355 |
| 6,462,423 B1 | 10/2002 | Akram et al. | ............... | 257/778 |

(Continued)

FOREIGN PATENT DOCUMENTS

TW        2004-236294        *    8/2003

*Primary Examiner*—Michael Lebentritt
*Assistant Examiner*—James M Mitchell
(74) *Attorney, Agent, or Firm*—Duane Morris, LLP

(57) ABSTRACT

In accordance with the objectives of the invention a new arrangement is provided for ESD protection of mounted flip chips. In a first embodiment of the invention, the Input/Output cells and power cells are provided with ESD protection that is connected to a dedicated bump pad. The substrate of the flip chip package interconnects all of the dedicated bump pads, completing the ESD network. Under the second embodiment of the invention, the Input/Output cells and power cells are provided with ESD protection that is connected to a dedicated bump pad, a last metal layer interconnects all of the dedicated bump pads, completing the ESD network.

18 Claims, 3 Drawing Sheets

U.S. PATENT DOCUMENTS

| | | | |
|---|---|---|---|
| 6,693,361 B1* | 2/2004 | Siniaguine et al. | 257/777 |
| 6,861,762 B1* | 3/2005 | Rotem | 257/778 |
| 6,914,333 B2* | 7/2005 | Lo et al. | 257/737 |
| 6,943,063 B2* | 9/2005 | Tsai et al. | 438/118 |
| 7,067,914 B2* | 6/2006 | Malinowski et al. | 257/723 |
| 2002/0185305 A1* | 12/2002 | Chiang | 174/257 |
| 2003/0090861 A1* | 5/2003 | Lee et al. | 361/679 |
| 2003/0162319 A1* | 8/2003 | Crane et al. | 438/106 |
| 2003/0235019 A1* | 12/2003 | Ker et al. | 361/56 |

* cited by examiner

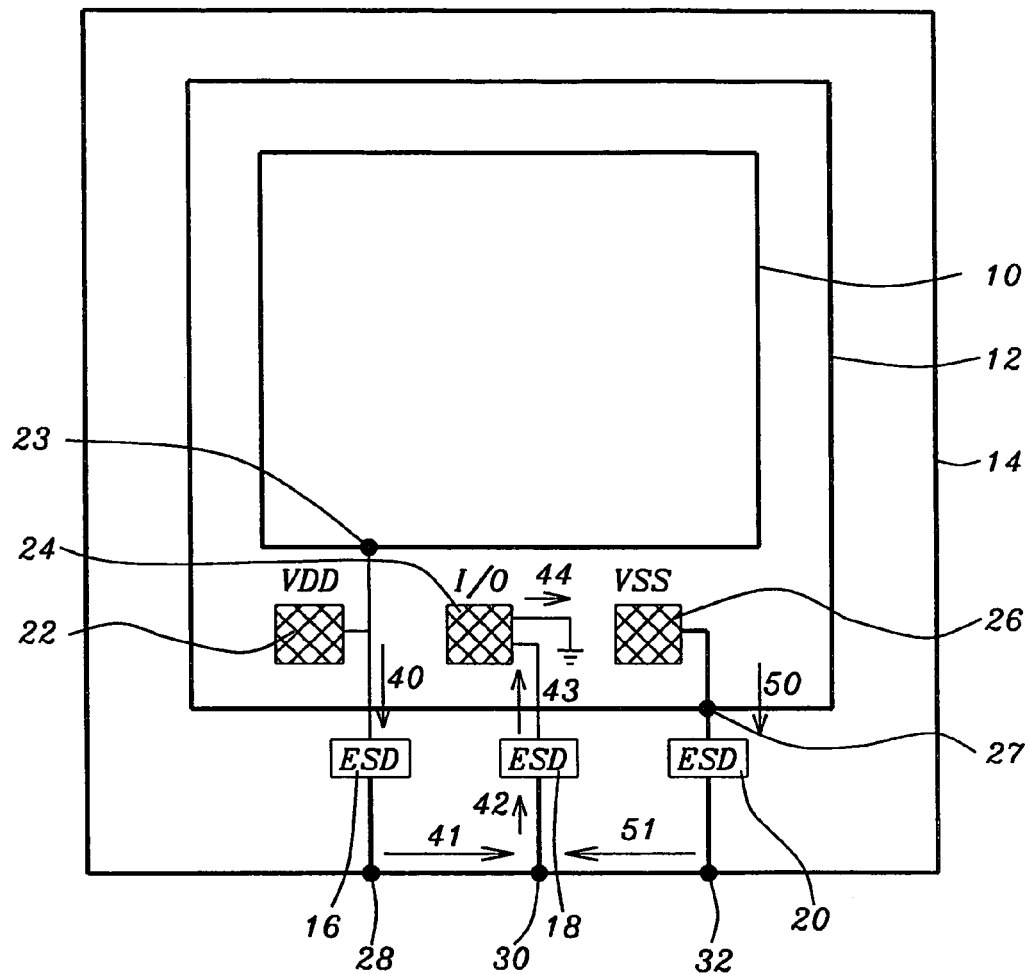
FIG. 1 – Prior Art

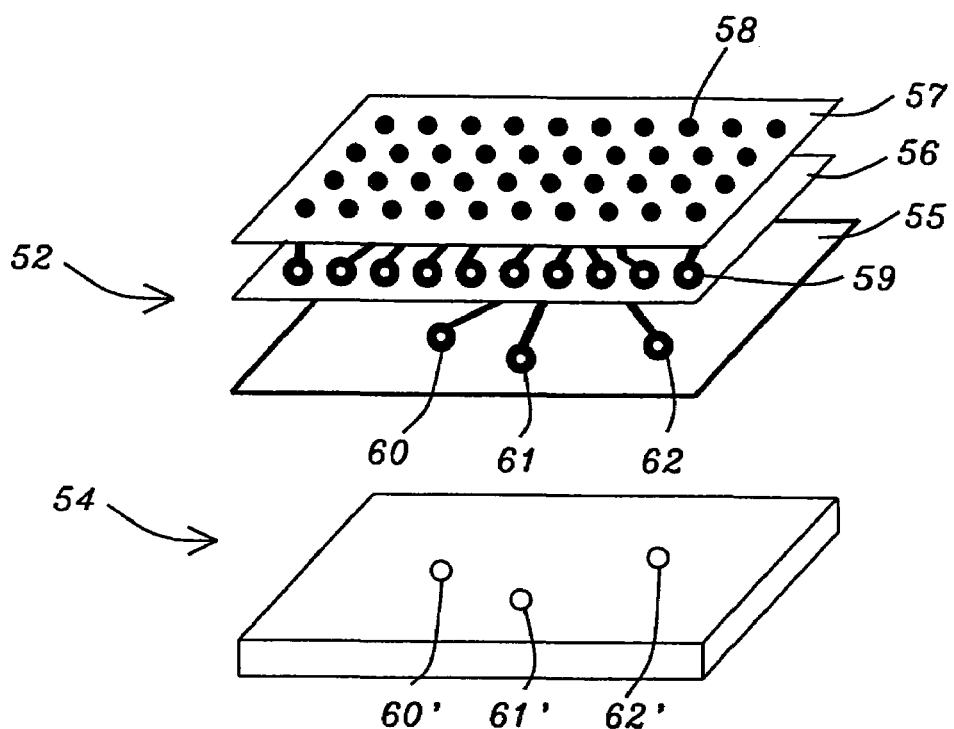
FIG. 2 - Prior Art
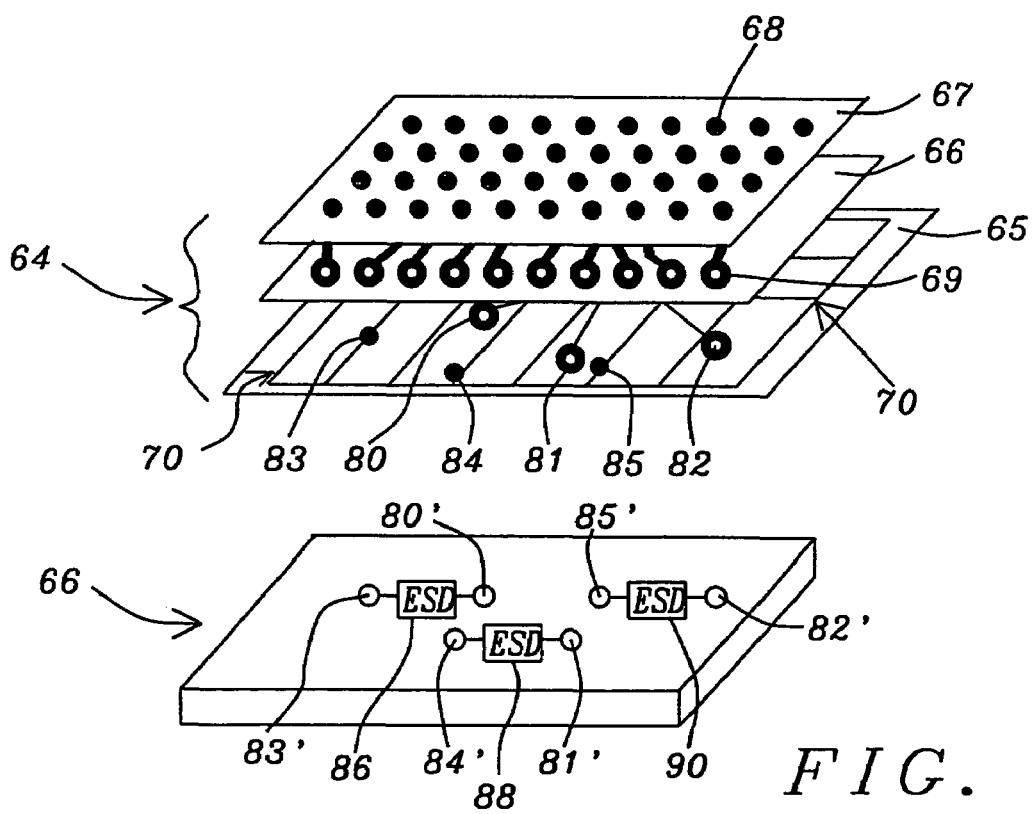
FIG. 3

SUBSTRATE BASED ESD NETWORK PROTECTION FOR A FLIP CHIP

CROSS REFERENCE TO RELATED APPLICATION

This is a continuation of currently pending U.S. nonprovisional application Ser. No. 10/308,446, filed Dec. 3, 2002 now U.S Pat. No. 6,849,479, by Chau-Neng Wu, titled "Substrate Based ESD Network Protection Method for Flip Chip Design," the entire contents of which is incorporated herein by reference.

BACKGROUND OF THE INVENTION (1) Field of the Invention

The invention relates to the fabrication of integrated circuit devices, and more particularly, to a method of providing Electro Static Discharge protection as part of packaging a flip chip.

(2) Description of the Prior Art

Flip chip technology is a technique whereby interconnections are made between a first array of contact points provided over an active surface of a semiconductor chip and a second array of contact points provided over the surface of a flip chip supporting substrate. Typically, solder bumps are provided as terminals over the active surface of the flip chip, these solder bumps are aligned and bonded with contact pads provided over the surface of a substrate that serves as a semiconductor device mounting support.

Flip chip bonding provides advantages of a reduction in the interconnection length, a smaller package footprint and allows for a lower package profile when compared with conventional wire bond packages. Flip chip technology is not being limited to providing points of I/O interconnect of the mounted chip in accordance with a particular pattern or array. This technology can therefore provide points of I/O interconnect across the entire active surface of the mounted device and allows for significantly extending input/output capabilities of the mounted chip. The limitation that is in this case as yet in effect is a limitation of pitch or spacing between the points of electrical contact that are created over the joining surfaces.

One of the methods that has been employed for mounting semiconductor devices over a supporting substrate comprises the use of Ball Grid Array (BGA) contact points. In using BGA contact points a pattern of closely spaced contact balls is used over the active surface of the chip to provide interconnections between the flip chip and a supporting, frequently ceramic based, substrate. This approach, while allowing for an extension of I/O capabilities, presents problems of contact ball and solder joint reliability. This latter problem is greatly exacerbated by the impact of thermal cycling during the creation of the semiconductor device package and by excessive mechanical stress that is exerted on one or more of the applied contact balls due to lack of planarity of the interfacing points of contact.

One of the aspects of semiconductor packaging is the occurrence of Electro Static Discharge (ESD) whereby seemingly randomly acquired electric charges are released over a path of least resistance. The main source of the accumulation of the high voltage that results in an ESD is tribo-electricity, which is electricity that is caused by frictional rubbing between two contacting surfaces. Typically, ESD can result in a voltage peak of about 2,000 volts or more, which can result in a discharge of a current of about 1.5 amperes over a resistance of about 1,500 ohms.

The ESD can, due to its unpredictable nature and also due to the amount of discharge that can take place, result to device damage and must therefore by controlled or prevented. The invention addresses this concern and provides protection against ESD effects by providing a ESD network that results in controlled ESD without thereby damaging packaged flip chips.

U.S. Pat. No. 5,970,321 (Hively et al.) shows a flip-chip and ESD design.

U.S. Pat. No. 6,144,542 (Ker et al.) reveals ESD bus protection.

U.S. Pat. No. 6,078,068 (Tamura) shows an ESD bus/die edge seal.

SUMMARY OF THE INVENTION

A principle objective of the invention is to provide a method for ESD protection of packaged flip chips whereby no penalty is incurred of requiring chip surface area for the implementation thereof.

Another objective of the invention is to provide a method for ESD protection of packaged flip chips that provides ESD protection for the entire mounted flip chip.

Yet another objective of the invention is to provide a method for ESD protection of packaged flip chips that utilizes the mounting substrate for this purpose.

In accordance with the objectives of the invention a new method is provided for ESD protection of mounted flip chips. In a first embodiment of the invention, the Input/Output cells and power cells are provided with ESD protection that is connected to a dedicated bump pad. The substrate of the flip chip package interconnects all of the dedicated bump pads, completing the ESD network. Under the second embodiment of the invention, the Input/Output cells and power cells are provided with ESD protection that is connected to a dedicated bump pad, a last metal layer interconnects all of the dedicated bump pads, completing the ESD network.

BRIEF DESCRIPTION OF THE DRAWINGS

FIG. 1 shows a top view of a flip chip in or over the surface of which conventional ESD protection has been provided.

FIG. 2 shows a three dimensional view of conventional ESD protection implementation.

FIG. 3 shows a cross section of the ESD protection provided under a first embodiment of the invention, whereby an ESD interconnect network has been provided in or over a layer of a flip chip supporting substrate.

DESCRIPTION OF THE PREFERRED EMBODIMENTS

Figure 4:
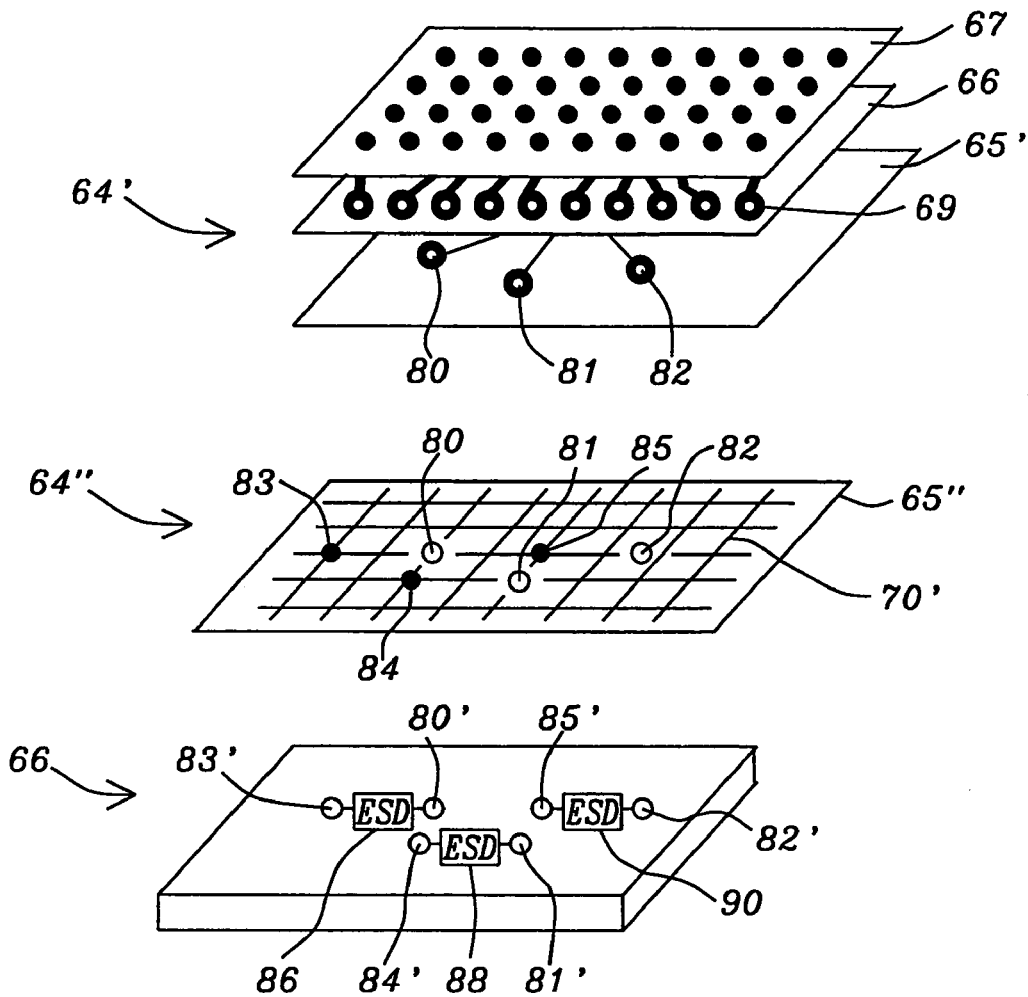
FIG. 4 shows a cross section of the ESD protection provided under a second embodiment of the invention, whereby an ESD interconnect network has been provided in or over an additional layer of interconnect traces that forms part of a flip chip supporting substrate.

Unpackaged or bare semiconductor die are used to construct multi-chip modules and other electronic devices. For the prevention or the controlled discharge of randomly accumulated electrical charges, also referred to as Electro Static Discharge (ESD), ESD protection circuits are conventionally provided. These protective ESD circuits are typically located between the input/output pads on the die and the transistor gates to which the pads are electrically connected. The ESD circuits provide a path from the input/output (I/O) pads to a ground pad, or to a power or bias voltage path for the die. This electrical path is designed to be actuated by a high voltage, such as an electrostatic discharge, that occurs at for instance input or output pads of a die.

The layout and design of a semiconductor die typically includes a core logic surface area that is bounded by a ring of input/output cells. Each of the I/O cells includes a bond pad that is used to interconnect the logic circuitry contained within the logic surface area with interconnections of the package in which the semiconductor die will be mounted. Typically, the I/O cells will contain transistors that provided ESD protective circuits in additional to other functional components such as pre-driver circuits, driver circuits, input buffers and the like.

With the use of ESD devices, the use of an ESD bus has recently gained acceptance. An ESD bus is required in the design of semiconductor devices to enable interruptions of for instance a Vss bus when cuts are provided in the Vss bus in order to separate different types of internal Vss busses.

One of the prior art methods for ESD provision is first highlighted using FIG. 1. Shown in FIG. 1 is a top view of an ESD interconnect scheme that is conventionally provided over the surface of a flip chip. Specifically highlighted in the top view of FIG. 1 are the Vdd bus 10, the Vss bus 12 and the ESD bus 14. Vss and Vdd are voltage levels that are provided for operational purposes of the flip chip and do not need to be further discussed at this time.

Further highlighted in the top view of FIG. 1 are a Vdd contact pad 22, an I/O contact pad 24 and a Vss contact pad 26, with:
  ESD device 16 providing an ESD path for Vdd contact pad 22
  ESD device 18 providing an ESD path to I/O contact pad 24, and
  ESD device 20 providing an ESD path for Vss contact pad 26.
  Points:
  23 provides an interconnect between the Vdd bus 10 and the Vdd contact pad 22, and
  27 provides an interconnect between the Vss bus 12 and the Vss contact pad 26.

For purposes of ESD discharge, the I/O pad 24 is considered a ground connection. If therefore, as a first example, an electrostatic surcharge occurs on Vdd contact pad 22, the ESD current follows the path 40-41-42-43-44 (ground). If further, as a second example, an electrostatic surcharge occurs on Vss contact pad 26, the ESD current follows the path 50-51-42-43-44 (ground). By therefore placing ESD devices 16 and 20 between Vss/Vdd pads 22/26 and the ESD bus 14, the ESD bus 14 carries current from the stressed pads 22/26 to the ground or I/O pad 24.

From the top view that is shown in FIG. 1 can be derived:
  A major bus in the above highlighted configuration is the ESD bus 14, which is provided over the surface of the flip chip and which collects ESD of the various voltage pads and leads this discharge to the I/O pad 24
  An ESD protection device, such as devices 16, 18 and 20, are provided between the corresponding contact pad and the ESD bus 14, and
  A significant amount of chip surface area is consumed by the ESD scheme that is shown in top view in FIG. 1.

Referring now specifically to FIG. 2, there is shown a three dimensional view of a package substrate 52 and a flip chip 54 over or in the surface of which semiconductor devices have been created. The substrate 52 has been highlighted as having three layers 55, 56 and 57, with layer 55 being a lower layer, layer 56 being a middle layer and layer 57 being an upper layer. The layers 55, 56 and 57, which need not be limited to three layers, serve the conventional purpose of extending flip chip interconnect capabilities. The extended flip chip interconnect capabilities are not germane to the invention and will therefore not be further discussed. As representative examples of interconnect metal are highlighted contact pad 58 in upper layer 57, interconnect trace 59 in the middle layer 56 and contact points 60, 61 and 62 in the lower layer 55. The latter three contact points 60, 61 and 62 align with matching and therewith aligned contact points 60', 61' and 62' provided over the active surface of flip chip 54.

Solder bumps, such as solder bumps 60', 61' and 62', provided over the active surface of flip chip 54 are aligned with corresponding points of electrical contact provided over the surface of substrate 52, such as points of electrical contact 60, 61 and 62, and joined together typically be applying reflow to the solder bumps.

The invention will now be described in detail using FIGS. 3 and 4 for this purpose.

Referring now to FIG. 3, there are shown three dimensional views of substrate 64, such as a Printed Circuit Board (PCB), and flip chip 66. Specifically highlighted in the three dimensional view 64 of the substrate are three levels 65, 66 and 67 of interconnect traces and contact points. Contact pads 68 are identical to contact pads 58 of FIG. 2, interconnect traces 69 are identical to interconnect traces 59 of FIG. 2.

The difference between FIGS. 3 and 2, and therewith the novelty of the invention, is shown in the lower layer 65 of the substrate 64 of FIG. 3 over the surface of which is provided an ESD network or mesh 70. It must first be noted that contact points 80, 81 and 82 remain in place in the lower layer 65, identical with contact points 60, 61 and 62 of FIG. 2. These three contact points 80, 81 and 82 in FIG. 3 can now be designated as follows:
  Contact point 80 is an I/O buffer contact point, functionally corresponding to point 30 of FIG. 1
  Contact point 81 is a Vdd contact point, functionally corresponding to point 23 of FIG. 1
  Contact point 82 is a Vss contact point, functionally corresponding to point 27 of FIG. 1

The latter three contact points 80, 81 and 82 align with matching and therewith aligned contact points 80', 81' and 82' provided over the active surface of flip chip 66.

The ESD mesh 70 has further been provided with contact pads 83, 84 and 85, which collectively are part of the ESD mesh 70 by being electrically connected thereto as shown in the three dimensional view of substrate 64 in FIG. 3. By now further providing corresponding and therewith aligned solder bumps 83', 84' and 85' over the surface of flip chip 66, and by providing ESD protective capability or devices:
  86 between contact points 83' and 80', functionally equivalent to ESD circuit 18 in FIG. 1,
  88 between contact points 84' and 81', functionally equivalent to ESD circuit 16 In FIG. 1, and
  90 between contact points 85' and 82', functionally equivalent to ESD circuit 20 in FIG. 1, It is clear that the required ESD capability has been provided by removing the ESD bus from the chip 66 and placing this bus on the substrate 64. It is further clear that the interconnect scheme that is required for providing ESD protection has been altered by removing a significant portion of this scheme, that is the portion that routes the ESD discharge to the ESD bus and the ESD bus itself, from the surface of chip 66 and placing this portion over a surface of the substrate 64 over which the flip chip is mounted.

The fist embodiment of the invention can be summarized as:

provifing a flip chip, ESD protection circuits have been provided in or over the surface of the flip chip providing, in or over the surface of the flip chip, first contact points that interconnect with the ESD circuits of the flip chip providing a substrate over the surface of which the flip chip is to be mounted, the substrate having been provided with conventional interconnect metal comprising metal traces and contact points providing second contact points over the surface of the substrate that align with correspond with the first contact points provided in or over the surface of a flip chip, and providing an ESD mesh or interconnect network over a surface of the substrate, the second contact points being interconnected with the ESD mesh of the substrate.

From the above it can be observed that the invention:

does not require extra surface area over the surface of the flip chip alleviates constraints of surface area over the surface of the flip chip allows for the creation of a low-resistance ESD interconnect network since this network is created over the surface of a supporting substrate, and ESD discharge current capabilities can be provided by providing an additional layer of interconnect metal, providing additional design flexibility for the ESD scheme; this is highlighted below as a second embodiment of the invention.

FIG. 4 shows three dimensional views of the second embodiment of the invention whereby, as in the first embodiment of the invention, ESD devices are provided between signal pads and ESD pads over the surface of the flip chip but where additionally aluminum capping is provided for the contact points that are part of the ESD mesh, therewith allowing the connection of the signal pads and the mesh pads to the ESD mesh.

This is shown in FIG. 4, where are highlighted layers 65' and 65", where layer 65' does not provide the interconnect ESD mesh 70. This design aspect is provided with the creation of a extra layer 65" of metal comprising an alternate ESD mesh 70' that now interconnects the contact pads 80-85 in accordance with design requirements that have been highlighted in FIG. 3. It must be noted in the three dimensional view of FIG. 4, section 64", that the contact pads 80, 81 and 82 are not connected to the alternate ESD mesh 70'. Contact pads 83, 84 and 85 are connected with the ESD mesh 70', as these contact points are connected to ESD mesh 70 of FIG. 3. The second embodiment of the invention therefore provides for separating the mesh 70 of FIG. 3 into two entities, which becomes clear by comparing FIGS. 3 and 4, as follows:

FIG. 3 shows that the ESD scheme of the first embodiment of the invention provides for a mesh with second contact points that align with first contact points provided over the flip chip, the first flip chip contact points being connected with ESD circuits of the flip chip FIG. 4 shows that the ESD scheme of the second embodiment of the invention is implemented by adding a layer of metal to the substrate, specifically view 52 of FIG. 3 is identical to View 64' of FIG. 4; added in FIG. 4 is the layer 64" over the surface of which the ESD scheme of the second embodiment of the invention is implemented.

Figure 5:
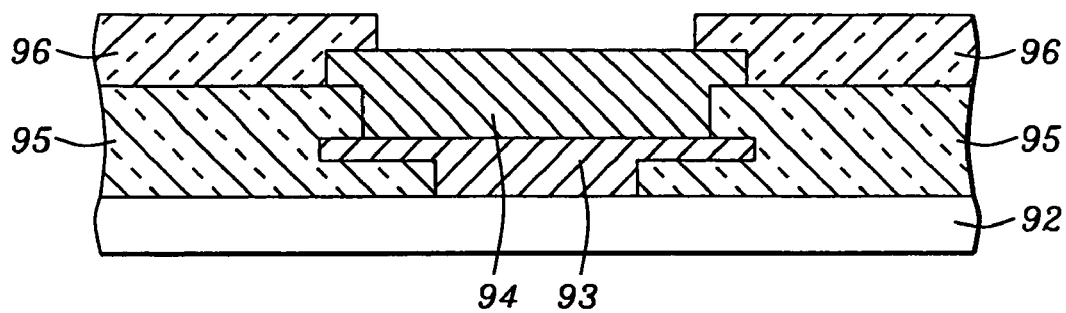
FIG. 5 shows a cross section of an actual implementation of the ESD mask of the invention.

To further illustrate how the additional ESD mask 70' can be created, the cross section of FIG. 5 has been provided. Highlighted in the cross section of FIG. 5 are a semiconductor surface 92, such as the surface of a layer of insulating material or dielectric. A copper level 93 has been created which represents the contact pads 83-85 of FIG. 4. Overlying the copper pad 93 is a layer 94 of patterned and etched metal, preferably comprising aluminum, which represents the additional ESD mesh 70' of FIG. 4. By patterning layer 94, an interconnect network of desired interconnect capabilities can readily be provided for the ESD mesh layer 70', FIG. 4. Layers 95 and 96 are layers of dielectric that are applied for the creation of metal layers 93 and 94 therein.

The invention, of method of creating an Electro Static Discharge (ESD) network for flip chip devices, can be summarized as follows:

providing a flip chip, the flip chip having been provided with at least one ESD circuit, such as circuits 86, 88 and 90, FIG. 3, in or over the surface thereof providing a first contact pad to the at least one ESD circuit, such as contact pads 80', 81' and 82', FIG. 3 providing a second pad for an ESD mesh to the at least one ESD circuit, such as contact pads 83', 84' and 85', FIG. 3 providing a substrate for mounting of a flip chip over the surface thereof, the substrate having been provided with interconnect metal in or over the surface thereof, such as substrate 64, FIG. 3 providing a third contact pad, such as contact pads 80, 81 and 82, FIG. 3, in or over an ESD layer, such as layer 65, FIG. 3, of the substrate 64, the third contact pad (80/81/82) being aligned with the first contact pad (80'/81'/82')

providing a fourth contact pad, such as contact pads 83, 84 and 85, FIG. 3, in or over the ESD layer 65 of the substrate 64, the fourth contact pad (83/84/85) being aligned with the second contact pad (83'/84'/85')

providing an ESD mesh 70, FIG. 3, over the ESD layer 65, FIG. 3, of the substrate 64, and connecting the fourth contact pad (83/84/85, FIG. 3) with the ESD mesh 70, FIG. 30.

The ESD layer may comprise a separate layer of interconnect metal, such as layer 65", FIG. 4.

The ESD layer may comprise a modified layer of interconnect metal, the modification comprising the fourth contact pad, the ESD mesh and the connection of the fourth contact pad with the ESD mesh provided to a layer of interconnect metal having been provided with the third contact pad, such as layer 65, FIG. 3.

The invention, of providing a method of creating an Electro Static Discharge (ESD) network for flip chip devices, can alternatively be summarized as follows:

providing a flip chip, such as flip chip 66 shown in FIG. 3, the flip chip having been provided with at least one ESD circuit in or over the surface thereof, such as ESD circuits 86, 88 and 90 shown in FIG. 3 providing a first contact pad to the at least one ESD circuit in or over the surface of the flip chip, such as contact pads 80', 81' and 82' provided over the active surface of flip chip 66 shown in FIG. 3 providing a second contact pad for an ESD mesh to the at least one ESD circuit in or over the surface of the flip chip, such as solder bumps 83', 84' and 85' over the surface of flip chip 66 shown in FIG. 3 providing a substrate for mounting of the flip chip over the surface thereof, such as substrate 64 shown in FIG. 4, the substrate having been provided with interconnect metal in or over the surface thereof, such as interconnect metal 69 and 68 and ESD mesh (layer) 70 shown in FIG. 3 providing a third contact pad in or over an ESD layer of the substrate, such as the three contact points 80, 81 and 82 of ESD mesh 70 that align with matching and therewith aligned contact points 80', 81' and 82' provided over the active surface of flip chip 66, the third contact pad (80', 81', 82')

providing a fourth contact pad in or over the ESD layer of the substrate, such as contact pads 83, 84 and 85 shown in FIG. 3, the fourth contact pad 83, 84, 85) being aligned with the second contact pad (83', 84', 85')

providing and ESD mesh over the ESD layer of the substrate, such as ESD mesh 70 shown in FIG. 3, and connecting the fourth contact pad with the ESD mesh, such as contact pads 83, 84 and 85 being connected to ESD mesh 70.

Although the invention has been described and illustrated with reference to specific illustrative embodiments thereof, it is not intended that the invention be limited to those illustrative embodiments. Those skilled in the art will recognize that variations and modifications can be made without departing from the spirit of the invention. It is therefore intended to include within the invention all such variations and modifications which fall within the scope of the appended claims and equivalents thereof.

What is claimed is:

1. An Electro Static Discharge (ESD) network for a semiconductor device, comprising:
    a chip having at least one ESD circuit in or on a surface of the chip;
    first and second contact pads connected to the ESD circuit;
    a substrate for mounting of the chip, the substrate having an interconnect metal layer;
    a third contact pad formed in or over an ESD layer of the substrate, the third contact pad being aligned with the first contact pad;
    a fourth contact pad formed in or over the ESD layer, the fourth contact pad being aligned with the second contact pad; and
    an ESD mesh formed over the ESD layer of the substrate;
    wherein the fourth contact pad is connected with the ESD mesh; and
    wherein the ESD layer comprises a modified layer of interconnect metal, the modified layer comprising, the third and fourth contact pads and the ESD mesh, wherein the fourth contact pad is connected to the ESD mesh.

2. The ESD network of claim 1, wherein the ESD layer comprises a separate layer of interconnect metal.

3. The ESD network of claim 1, wherein the substrate comprises a Printed Circuit Board (PCB).

4. The ESD network of claim 1, wherein the first and second contact pads comprise copper.

5. The ESD network of claim 1, wherein the third and fourth contact pads comprise aluminum.

6. The ESD network of claim 1, wherein the ESD mesh comprises aluminum.

7. An ESD network for flip chip devices, comprising:
    a flip chip having an ESD circuit in or on the surface thereof;
    a first contact pad connected to the ESD circuit provided in or over the surface of the flip chip; a second contact pad for connecting an ESD mesh to the ESD circuit;
    a PCB for mounting the flip chip on the surface thereof, the PCB having interconnect metal in or over the surface thereof as well as an ESD layer;
    a third contact pad provided in or over the ESD layer of the PCB, the third contact pad being aligned with the first contact pad;
    a fourth contact pad provided in or over the ESD layer of the PCB, the fourth contact pad being aligned with the second contact pad; and
    an ESD mesh on the ESD layer of the PCB;
    wherein the fourth contact pad is connected with the ESD mesh; and
    wherein the ESD layer comprises a modified layer of interconnect metal, the modified layer comprising the third and fourth contact pads and the ESD mesh, wherein the fourth contact pad is connected to the ESD mesh.

8. The ESD network of claim 7, wherein the ESD layer comprises a separate layer of interconnect metal.

9. The ESD network of claim 7, wherein the ESD layer comprises a separate layer of interconnect metal.

10. The ESD network of claim 7, wherein the substrate comprises a Printed Circuit Board (PCB).

11. The ESD network of claim 7, wherein the first and second contact pads comprise copper.

12. The ESD network of claim 7, wherein the third and fourth contact pads comprise aluminum.

13. The ESD network of claim 7, wherein the ESD mesh comprises aluminum.

14. An Electro Static Discharge (ESD) network comprising:
    an integrated circuit (IC) device having an ESD circuit in or on a surface of the device, the ESD circuit having first and second contact pads;
    a substrate for attachment of the chip, the substrate having interconnect metal thereon, the substrate further having an ESD layer with third and fourth contact pads formed in or on the ESD layer; wherein the third and fourth contact pads are aligned with the first and second contact pads, respectively; and
    an ESD mesh formed over the ESD layer;
    wherein the fourth contact pad is connected with the ESD mesh.

15. The ESD network of claim 14, wherein the ESD layer comprises a layer of interconnect metal that is distinct from the substrate and the ESD mesh.

16. The ESD network of claim 14, wherein the ESD layer comprises a modified layer of interconnect metal, the modified layer comprising the third and fourth contact pads and the ESD mesh, wherein the fourth contact pad is connected to the ESD mesh.

17. The ESD network of claim 14, wherein the substrate comprises a Printed Circuit Board (PCB) and the IC device comprises a flip chip.

18. The ESD network of claim 14, wherein the first and second contact pads comprise copper.

* * * * *